United States Patent [19]

Loomis et al.

[11] 3,955,275

[45] May 11, 1976

[54] APPARATUS FOR CLOSING CLAM-SHELL HOUSINGS

[75] Inventors: Phillip Eugene Loomis, Harrisburg; Joe Pierce Morgan, Camp Hill, both of Pa.

[73] Assignee: AMP Incorporated, Harrisburg, Pa.

[22] Filed: Aug. 7, 1974

[21] Appl. No.: 495,370

Related U.S. Application Data

[63] Continuation-in-part of Ser. No. 368,159, June 8, 1973, abandoned.

[52] U.S. Cl. .................................... 29/628; 228/115

[51] Int. Cl.$^2$ .................. H01R 43/00; H05K 13/04; H01R 43/04

[58] Field of Search ........... 29/628, 203 D, 203 DT, 29/203 R, 630 A, 429, 631, 630 R; 228/1, 3.1, 44.1, 110, 115

[56] References Cited

UNITED STATES PATENTS

| | | | |
|---|---|---|---|
| 3,245,135 | 4/1966 | Netta et al. | 29/630 A |
| 3,380,140 | 4/1968 | Champ | 29/203 DT |
| 3,416,212 | 12/1968 | Bustler et al. | 29/203 DT |

*Primary Examiner*—James L. Jones, Jr.
*Assistant Examiner*—Robert C. Watson
*Attorney, Agent, or Firm*—Gerald K. Kita

[57] ABSTRACT

A method and apparatus for closing and bonding initially open clam-shell housings about articles such as electrical terminals or the like. The housings are initially in strip form, a plurality of the initially open clam-shell housings being interconnected to each other by hinge members which extend outwardly from either the ends or the sides of opposed housing parts. A leading housing of the strip is initially disposed at an assembly station and an article is conveyed laterally into the housing. Subsequently the housing is partially closed by engaging one of the housing parts of a clam-shell hcusing adjacent the leading housing and moving it towards its opposed housing part to cause corresponding movement of the housing parts of the leading clam-shell housing. A bonding tool now engages and moves a housing part of the partially closed leading housing into a closed position with respect to the other housing part, and it is then bonded to said other housing part to secure the housing parts to each other about an article. The interconnecting hinge members are sheared from the closed clam-shell housing and the assembly is then discharged from the assembly station.

21 Claims, 21 Drawing Figures

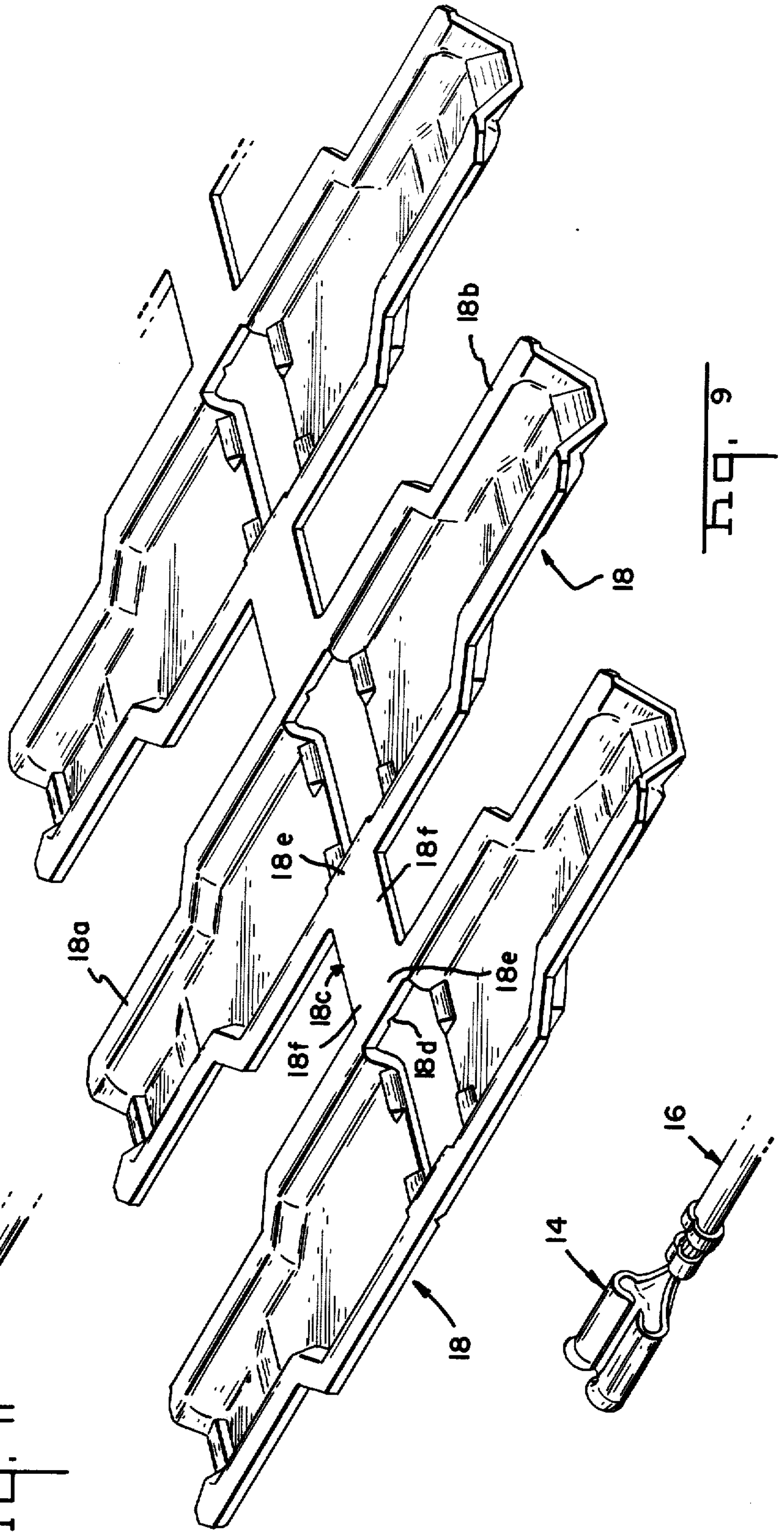
Fig. 9
Fig. 10
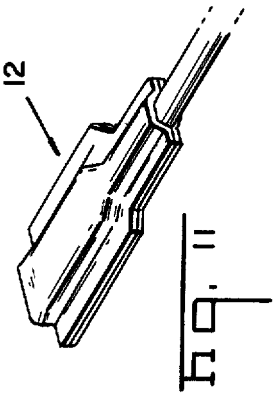
Fig. 11

172
174
180
178
176
182
54
52
153
163
184
118d
34
164
186
162
118b
118h
118g
14
118a
16
36
145

APPARATUS FOR CLOSING CLAM-SHELL HOUSINGS

CROSS REFERENCES TO RELATED APPLICATIONS

This application is a continuation in part of U.S. application Ser. No. 368,159 filed June 8, 1973, now abandoned.

FIELD OF THE INVENTION

The present invention relates generally to a method and apparatus for making electrical devices, and more particularly to a method and apparatus for mounting an insulating pod or housing about a terminal on the end of a conductor lead wire, the insulating pod or housing initially being interconnected to a plurality of other open housings in strip form, the plurality of housings being interconnected to each other by integral hinge members.

More particularly, the present invention is concerned with a method and apparatus for successively positioning unassembled insulating housings between assembly tools at an assembly station of a machine, for positioning an article such as a terminal or the like within the open housings, and for subsequently closing and bonding the initially open housing parts and trimming the hinge members away from the assembled unit.

BACKGROUND OF THE INVENTION

One commonly used type of electrical terminal has a ferrule portion and a receptacle portion, the ferrule portion being crimped onto a conductor wire, and the receptacle portion being adapted to receive a generally rectangular tab on a mating conductor to which the conductor wire is to be connected. The receptacle may be either straight or of the flag type. Terminals of this general type are often used in appliance and automotive wiring for the reasons that they accept a standard type of rectangular tab which is widely used in the industry. Under some circumstances it is desirable to insulate terminals of this type, particularly where a shock hazard or danger of short circuit exists. Terminals of this type are relatively inexpensive and therefore the means used for insulating the terminals and the cost of applying the insulating means to the terminals should also be relatively low.

Prior art terminals and machines for applying these terminals are shown in U.S. Pat. No. 3,380,140 issued Apr. 30, 1968 and also in U.S. Pat. No. 3,416,212 issued Dec. 17, 1968. As can be seen from these patents the insulating housings initially have two hingedly connected housing parts. Furthermore, these clam-shell housings are customarily provided to the apparatus in strip form, there being a plurality of open housings which are interconnected to each other by a common carrier which is connected to one end of the plurality of housings remote from the hinge. The insulating housings shown in these patents are designed for receiving terminals of the flag type wherein the receptacle portion extends laterally from the axis of the wire. They are not particularly suitable for receiving terminals having straight receptacle portions of the type which receives the connector tab in line with the axis of the wire as it is somewhat difficult to sever the connecting strip from the insulating housing after it has been secured to a straight receptacle as the connector strip must be severed in the area of the conductor wire.

Furthermore, the apparatus shown in these two patents requires manual feeding of the terminals, the terminals being fed across the ends of the terminal until they are suitably inserted within the housing parts. This form of apparatus does not lend itself to machine conveying of leads which have the terminals fixed thereto to the applicator station.

In co-pending U.S. application Ser. No. 427,746 there is a disclosure of a succession of insulation housings in the form of a continuous strip of housings in spaced apart, side by side relationship where adjacent clam-shell housings are connected to each other by a central connecting strip which also functions as a hinge between the two housing parts and also interconnects corresponding housing parts of adjacent housings. This form of housing can more readily be assembled about straight receptacle terminals which have previously been secured to lead wires. The method of applying the housings as disclosed in the aforementioned patent application involves fully closing together the respective two housing parts of each of the housings prior to the arrival of the housings at the assembly station and then allowing the housing parts of the leading housing to slightly open at the assembly station. The terminated end of the conductor wire is then manually fed through the open ends of the housing parts by moving the conductor wire axially, after which the housing parts are assembled together about the terminated ends of the wire.

The apparatus disclosed by the aforementioned Patent Application for carrying out the disclosed method is believed to be satisfactory for its intended purpose, that being as a semi-automatic bench type of applicator. However, the design of this apparatus does not lend itself to a more fully automatic operation wherein the terminated ends of the conductor wires are fed laterally between the sides of partially open housing parts. The required hand feeding of the terminated ends of the conductor wires to the applicator appears to inherently limit the possibility of achieving any further increases in production rates above a range of 1500 to 2000 housing applications per hour and thus inherently limits the possibility of further reductions in the costs of applying the housings. As the housing parts of the leading housing at the assembly station are only open within a range of 30° to 45°, the approach path along which the terminated wire is moved is substantially limited to a front end feed path disclosed in the aforementioned patent application. Furthermore, difficulty will be encountered in trying to design apparatus which will automatically feed the terminated ends of the wire between the housing parts at production rates above the aforementioned range when the housing parts are initially in their slightly open position irrespective of the direction of feed of the terminated ends relative to the housing parts.

The aforementioned limitations and difficulties of the semi-automatic bench type of applicator apparatus disclosed by the aforementioned Patent Application are substantially overcome by the apparatus disclosed in the present application. The automatic nature of the apparatus disclosed in this application and the substantially higher production rate achieved thereby is, in part, accomplished by disposing the housing parts initially at the assembly station of this apparatus in an open position wherein lateral movement of the terminal into the housing area may be advantageously accomplished. In the invention disclosed by the first and second co-pending applications cross-referenced above, each relates to a method and apparatus incorporated into one embodiment of the disclosed apparatus which further contributes to the automatic nature of the apparatus and the substantially higher production rate achieved thereby.

OBJECTS AND SUMMARY OF THE INVENTION

It is an object of the present invention to provide a method and apparatus to position a substantially open leading clam-shell housing of a plurality of clam-shell housings at an assembly station, the plurality of clam-shell housings being interconnected to each other by integral hinge members, to place an article within the open leading clam-shell housing, to close the housing about the article to assemble it therein, and to subsequently separate the closed housing from the other interconnected housings by severing the integral hinge members adjacent the sides of the closed housing.

Another object of the invention is to provide a method and apparatus for positioning the open housing parts of a leading housing of a succession of interconnected housings between assembly tools for engagement by the tools without the aid of any physical means which would obstruct the relative movement of the tools towards each other during the assembly of the housing parts of the leading housing to an electrical device.

It is another object of the present invention to provide a novel apparatus for shearing the closed housing from interconnected integral hinge members.

These and other objects of the invention are accomplished in an apparatus having an assembly station which includes a seat portion which receives one of the housing parts of an initially open leading clam-shell housing. This housing is also initially interconnected to a plurality of other clam-shell housings by integral hinge members. The integral hinge members may extend either from the end of the housing parts or from the sides thereof. Two differing forms of apparatus are shown in the drawings, one form of apparatus being suitable for closing clam-shell housings which are initially interconnected to a plurality of other clam-shell housings by integral hinge members which extend outwardly from the ends of the housings, and the other form of apparatus being suitable for closing clam-shell housings which are initially interconnected to a plurality of other housings by hinge members which extend outwardly from the sides of the housings. Each of the two forms of the apparatus shown include means to convey a terminated electrical lead to dispose the terminal within the open clam-shell housing at an assembly station, plunger means operable to contact a housing part of the next adjacent open clam-shell housing and to move it towards its other associated housing part to cause a similar housing part of the leading clam-shell housing to have a corresponding movement. Each of the embodiments of the apparatus shown in this application also include bonding tool means which fully close the housing parts of the leading clam-shell housing which have previously been partially closed by the plunger means, the bonding tools also bonding the two housing parts of the leading housing to each other to assemble the terminal within said housing. In one of the embodiments shown in this application, means are disposed for initially impingeing a stream of air upon the partially closed housing after it has been partially closed by the plunger and before it is contacted by the bonding tools. Both of the embodiments shown in this application also includes means for severing the leading housing from its associated integral hinge members, one embodiment having a single shear which severs the integral hinge members from the ends of the closed housing parts, and the other embodiment having a pair of oppositely disposed shears which severs the integral hinge members from the sides of the closed housing parts.

These and other objects and advantages of this invention will be apparent to those skilled in the art after a consideration of the following detailed description, taken in conjunction with the accompanying drawings in which preferred embodiments of this invention are illustrated.

BRIEF DESCRIPTION OF THE DRAWINGS

FIG. 3 is an enlarged fragmentary side view of a portion of the apparatus shown in FIG. 2, this view illustrating the leading housing of a plurality of interconnected housings in its desired predetermined position prior to the placement of a terminated end of a conductor lead wire within the housing.

FIG. 9 is a perspective view, on an enlarged scale, of one type of a plurality of clam-shell housings in strip form, the individual clam-shell housings of this type being joined together by integral hinge members which extend outwardly from the ends of the housing parts of the clam-shell housings.

FIG. 10 is a perspective view, on an enlarged scale, of an electrical terminal crimped on an electrically bared end of an insulated electrical conductor lead wire to which one of the housings is to be assembled.

FIG. 11 is a perspective view, on an enlarged scale, of the terminated lead wire of FIG. 10 having an individual insulating housing of the type shown in FIG. 9 assembled thereto.

DETAILED DESCRIPTION OF A FIRST EMBODIMENT

Figure 1:
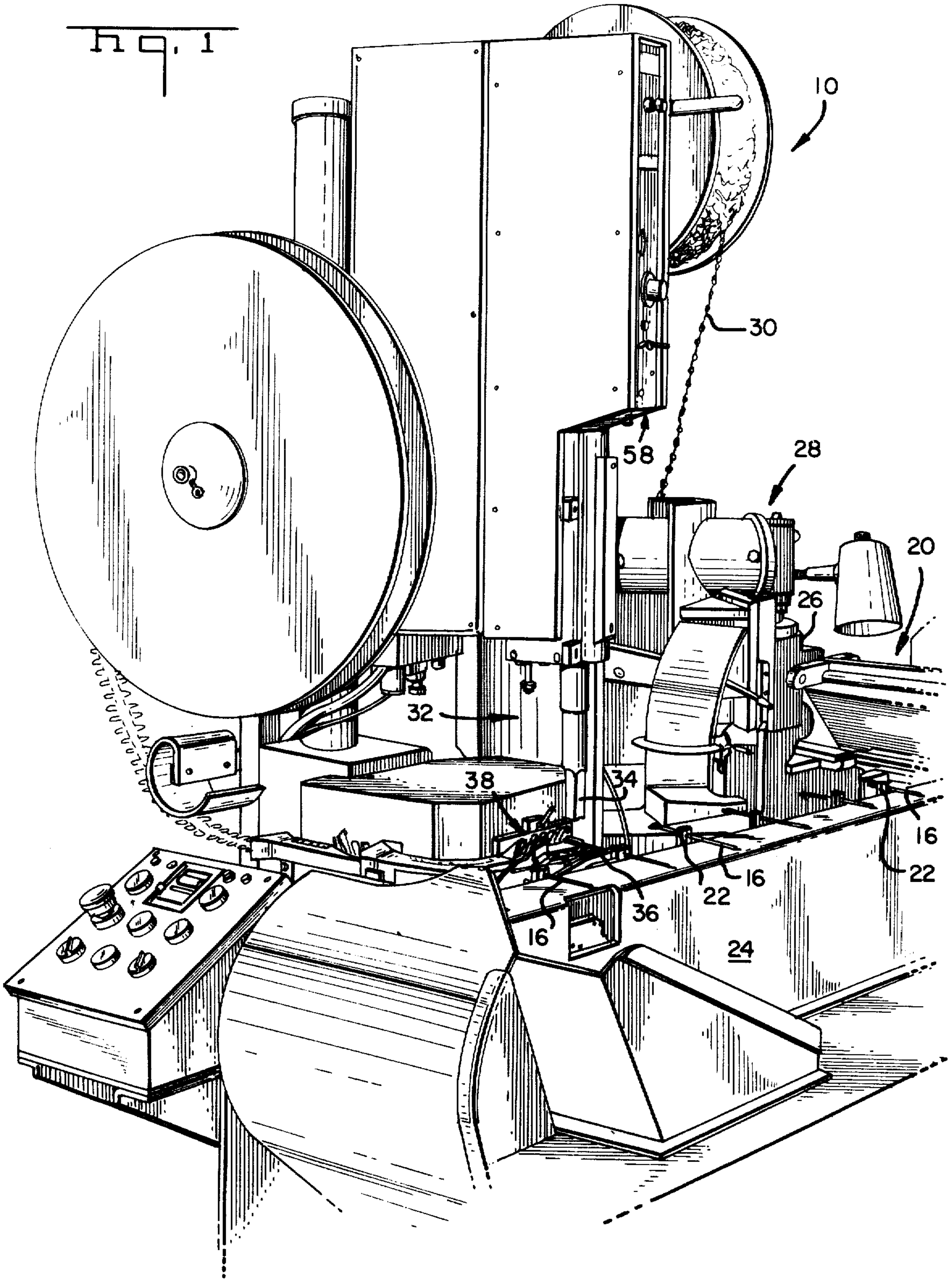
FIG. 1 is a perspective view of an assembly apparatus in which a first embodiment of this invention is incorporated.

Referring first to FIG. 1, an automatic lead making machine is indicated generally at 10. During each operating cycle of the machine 10 an insulating electrical connecting device 12 (FIG. 11) is assembled, the electrical connecting device including an article in the form of an electrical terminal 14 which is crimped onto the bared end of an insulated conductor lead wire 16 (FIG. 10), and also including an insulating housing 18 which is assembled about the terminated wire about the terminal 14 and an adjacent portion of the insulated conductor wire 16. The housing shown in FIG. 11 and which is assembled by the apparatus shown in FIGS. 1 through 8 is initially supplied to the apparatus in strip form shown in an enlarged perspective view in FIG. 9. Each of the clam-shell housings 18 include an opposed pair of housing parts 18*a*, 18*b*, made of deformable, bondable plastic material such as nylon, the housing parts 18*a*, 18*b* being preferably complementary shaped to accept the profile of the terminals 14 between the parts when they are closed about the terminal. The housing part identified as 18*a* will hereinafter be referred to as the lower or first housing part and the housing part 18*b* will be referred to as the second or upper housing part. Furthermore, adjacent clam-shell housings are interconnected to each other by integral hinge members 18*c*. Each of the integral hinge members has a notch 18*d* formed in its longitudinal mid-line, the notch 18*d* defining a hinge or bend line about which the first and second parts 18*a*, 18*b* will hingedly and pivotally move about each other. Each of the integral hinge members 18*c*, shown in FIG. 9, includes spaced apart side portions 18*e*, each side portion being interconnected to the ends of a complementary pair of first and second housing parts 18*a*, 18*b*. Each of the integral hinge members 18*c* also includes end portions 18*f* which extend between end portions of adjacent housing parts. A more detailed description of the housing is set forth in the aforementioned co-pending U.S. application Ser. No. 427,745, which description is incorporated herein by reference thereto.

In the apparatus shown at 10 the initial step towards the producton of the fully assembled connecting device is taken by conventional apparatus located at a first station, generally designated 20 and only partially shown in outline form shown in FIG. 1. The apparatus 20 is of a type which will, during each operating cycle of a machine 10, feed and cut lead wires 16 to a desired length and strip insulation from both ends of the wire. A detailed description of an apparatus which suitably performs the above described operations is set forth in U.S. Pat. Nos. 2,680,394 and 2,929,284.

The cut and stripped wire is then delivered to spaced apart conveying members or wire grippers 22 of a conveyor generally designated 24. The conveyor 24, which is generally of the type disclosed in U.S. Pat. No. 3,583,055, is indexed to the left as viewed in FIG. 1 to sequentially present the stripped trailing end of one of the conductor wires 16 to a conventional crimping press 26 located at a second station generally designated 28. The crimping press 26 shown in FIG. 1 may be of the type disclosed in U.S. Pat. No. 3,343,398.

The advancement of the conveyor 24 is arrested once during each operating cycle of the machine 10. Each advancement of the conveyor prior to its arrest will bring one of the stripped conductor wires 16 to the second station 28. During each period of arrest of the conveyor, the bared end of one of the conductor wires 16 located at the station 28 is positioned between a crimping die and an anvil of the press 26 by any suitable means such as, for example, a pair of positioning jaws as disclosed in U.S. Pat. No. 3,583,055. While one of the conductor wires is located at the station 28 a leading terminal 14 of a endless interconnected chain of terminals 30 is crimped to the stripped end of the lead wire 16 by the crimping press.

The individual operations performed at the first and second stations 20, 28 by themselves form no part of the present invention.

Figure 4:
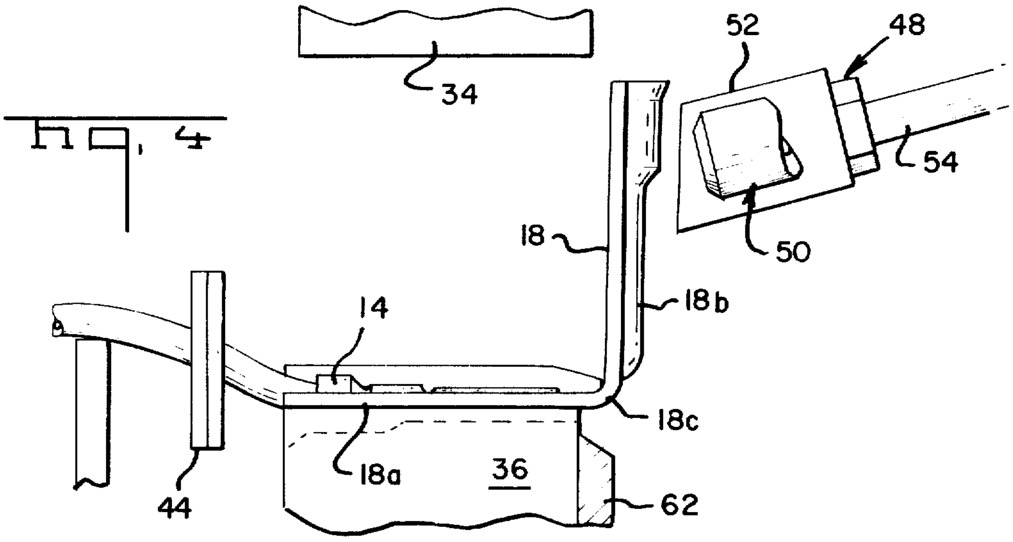
FIG. 4 is a schematic side view similar to FIG. 3 showing the disposition of the parts after an electrical connecting device has been positioned in the leading open housing.

During each operating cycle of the machine 10 one of the conductor wires 16 with the terminal 14 crimped thereon is advanced to a third station, indicated generally at 32 where the leading insulating housing 18 of a plurality of interconnected housings will be assembled about the terminal 14 at an assembly station defined by upper and lower ultrasonic bonding tools 34, 36, respectively. At the third station 32 the clam-shell housings 18 are initially disposed in open positions as shown in FIGS. 3 and 4, and the upper housing part 18*b* of the leading clam-shell housing is disposed at substantially right angles to the lower housing part 18*a* which is received within a seat of the lower bonding tool 36. Means are provided to subsequently dispose the upper housing part at an oblique angle with respect to the lower housing part after the terminal has been placed therein. The upper housing part will then lie across the predetermined path of movement of the pair of ultrasonic bonding tools 34, 36 for engagement by the upper tool without the aid of any physical means which would either obstruct the relative movement of the tools towards each other during the assembly or final closing of the housing parts 18*a*, 18*b* about the terminated end of the conductor wire 16, or obstruct the movement of the terminal across the sides of the open clam-shell housing as the terminal is conveyed to a position in alignment with the open clam-shell housing parts.

Figure 2:
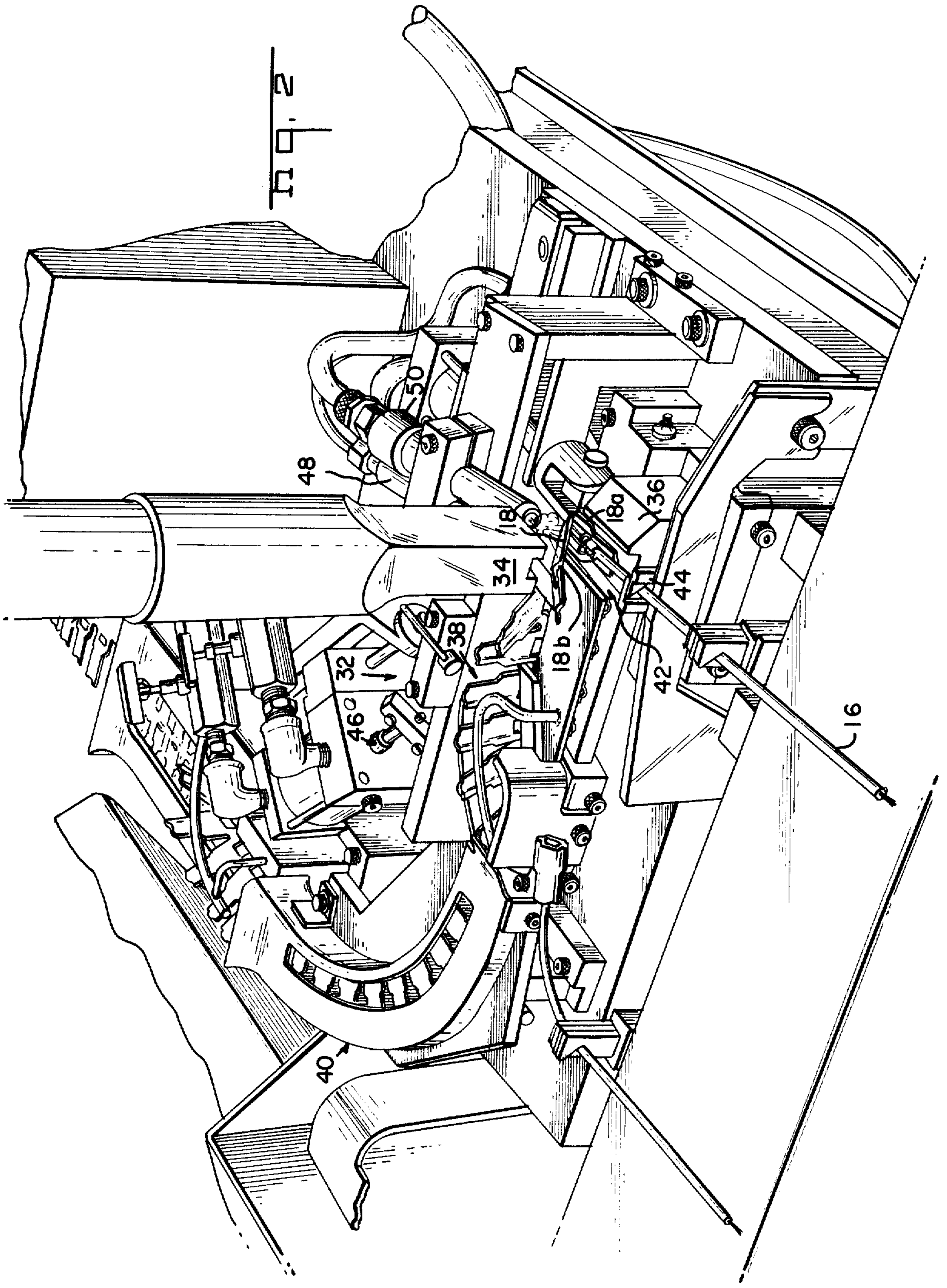
FIG. 2 is a perspective view, on an enlarged scale, of a portion of the apparatus shown in FIG. 1.
Figure 7:
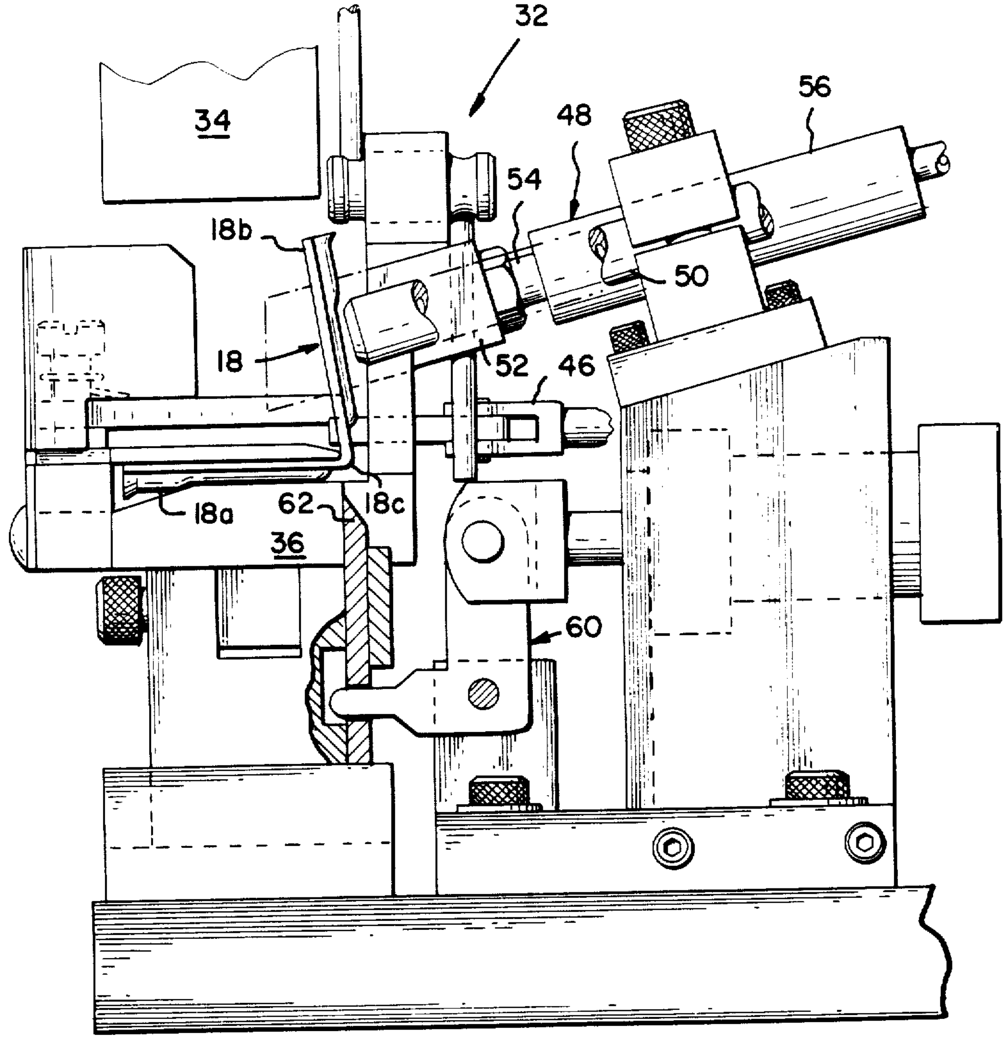
FIG. 7 is a view similar to FIG. 6 showing completion of the bonding of the housing parts by the bonding tools following retraction of the plunger mechanism.

The manner in which the leading housing is brought into the assembly station of the apparatus shown in this embodiment is more fully disclosed in co-pending application Ser. No. 397,908. This application, which is incorporated herein by reference thereto, discloses that the housing parts 18*a*, 18*b* of each housing 18 of a leading group thereof, generally designated 38 in FIG. 2, are initially disposed at an approximate 90° angular displacement with respect to each other by utilizing a guide track 40 (FIG. 2). The guide track 40 has an end, generally designated at 42, disposed proximate to the bonding tools 34, 36 and also proximate to an article positioning mechanism 44. The housings 18 are intermittently advanced along the guide track 40 by a feeding mechanism 46.

After a leading housing 18 has been positioned at the assembly station, the terminated end of one of the conductor wires 16 is placed between the first and second housing parts 18*a*, 18*b*. In this regard, it should be noted that as the conveyor is indexed to the position shown in FIG. 2, the terminal 16 is moved between the sides of the open leading clam-shell housing. After the conveyor comes to rest the lead wire 16 at station 32 is then engaged by the article positioning mechanism 44 to move the terminal into the lower clam-shell housing part 18*a*. The article positioning mechanism 44 is more fully disclosed in co-pending U.S. application Ser. No. 397,916.

Figure 5:
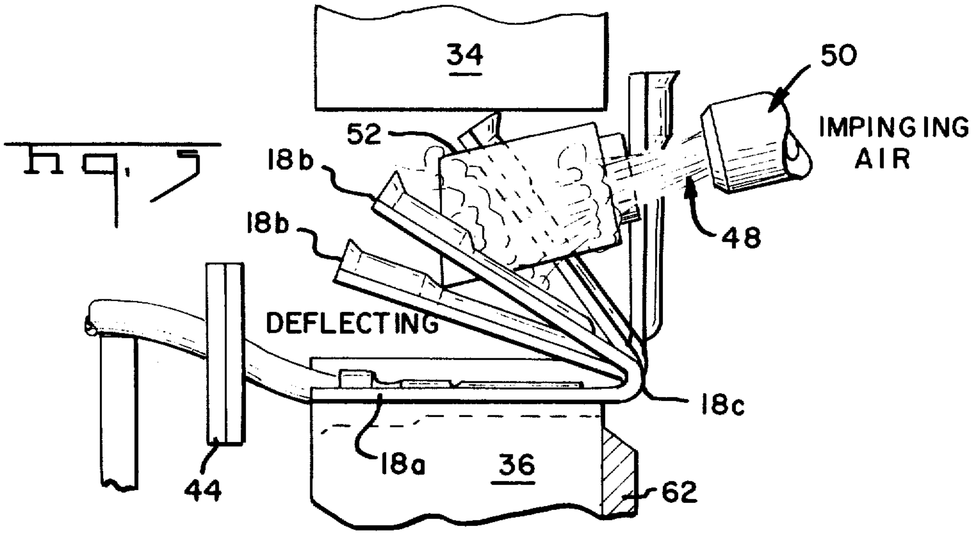
FIG. 5 is a view similar to FIG. 4 showing the disposition of the housing parts after one of the housing parts of the clam-shell housing adjacent to the leading housing has been partially closed by plunger means.

After placement of the article 14 between the housing parts 18*a*, 18*b*, of the leading housing 18 and on the first housing part 18*a* as shown in FIG. 4, the upper housing part 18*b* is moved from its generally perpendicular position shown in FIG. 4 to the position shown in FIG. 5 wherein it is disposed at an angle of from 30° to 45° relative to the lower housing part 18*a*. This is accomplished by moving the upper housing part 18*b* of the housing 18 adjacent the leading housing by a reciprocal plunger mechanism 48 to a predetermined angular displacement of approximately 60° to its position shown in FIG. 5. The path of the reciprocal plunger mechanism is such that at all times it is outside the path of movement of the tools 34, 36. The pivotal movement imparted to the upper housing part 18*b* of the clam-shell housing immediately adjacent the leading housing causes corresponding pivotal movement of the upper housing part 18*b* of the leading housing due to the interconnecting integral hinge members 18*c*. Thus, as one upper housing part 18*b* is moved toward its associated lower housing part 18*a* the portion of the integral hinge member to one side of the notch 18*d* will have corresponding movement which will in turn impart such corresponding movement to the next adjacent corresponding housing part. The displacement of the upper housing part contacted by the reciprocal plunger mechanism 48 is customarily somewhat greater than the resulting angular displacement of the adjacent housing part as can readily be seen from FIG. 5. The amount of angular displacement actually imparted to the next adjacent housing part by the plunger will vary in accordance to the design of the hinge and the nature of the material employed in the manufacture of the insulating housings 18.

If the upper housing part 18*b* of the leading clam-shell housing does not close sufficiently, it may be necessary to provide additional closing means before the upper housing part may be contacted by the upper ultrasonic bonding tool 34. In this regard, it should be noted that the upper housing part 18*b* should not extend away from the lower housing part 18*a* at an angle greater than 45° prior to contact by the ultrasonic bonding tool 34. If in operation the housing part 18*b* does not sufficiently close when the housing part 18*b* of the next adjacent housing is contacted by the plunger, then an air blast may be employed to further close the housing part. In this regard a stationarily-positioned air supply mechanism 50 (FIG. 5) would be located adjacent to the leading housing 18 and be aimed toward the upper housing part 18*b* of the leading housing 18, the air supply mechanism impinging a stream of air on the upper housing part 18*b* of the leading housing 18 disposing the upper housing part 18*b* of the leading housing across the path of movement of the tools 34, 36 and between the lower housing part 18*a* and the upper tool 34.

The reciprocal plunger mechanism 48 includes a plunger 52 (FIG. 3) mounted on one end of a piston rod 54 which extends from a cylinder 56 appropriately mounted on the machine 10 so as to aim the plunger 52 towards the upper housing part 18*b* of the clam-shell housing disposed immediately adjacent the clam-shell housing at the assembly station.

During each operating cycle of the machine 10 the piston rod 54 advances the plunger 52 from its retracted full line position shown in FIG. 3 to its extended dotted line position also shown in FIG. 3.

Figure 6:
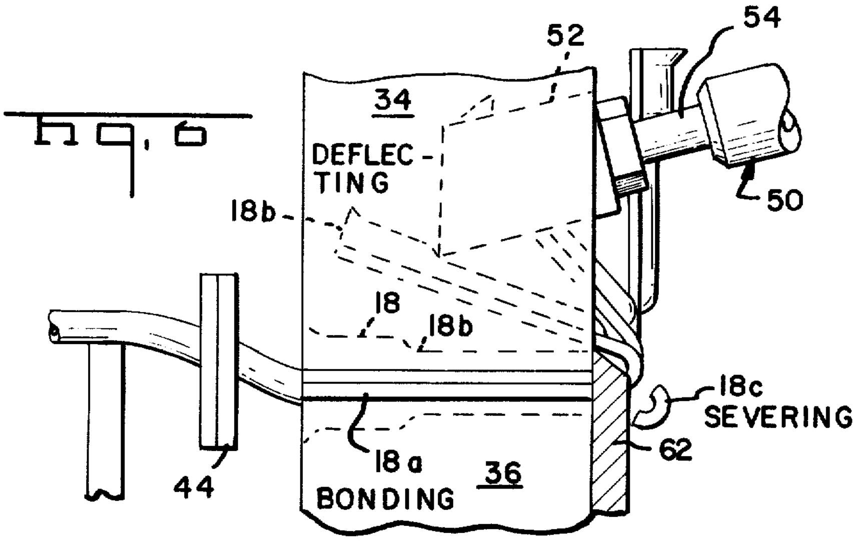
FIG. 6 is a view similar to FIG. 5 showing the leading clam-shell housing in a fully closed position with a bonding tool in contact with the upper surface of the leading housing, and also showing the manner in which the integral hinge members which extend outwardly from the ends of the housing parts are severed.
Figure 7:
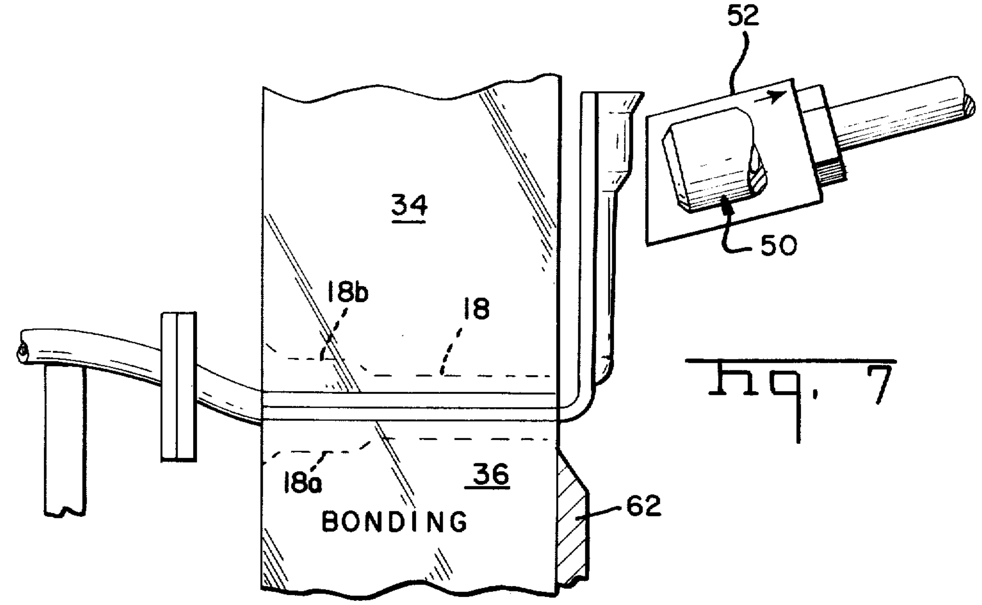

Referring now to FIG. 6, the plunger 52 is maintained by the piston rod 54 in its extended position to hold the upper housing part 18*b* of the clam-shell housing adjacent the leading clam-shell housing at its aforementioned angular displacement until after the upper bonding tool 34 has moved the upper housing part 18*b* of the leading housing towards the lower housing part 18*a* and into flush contacting relationship therewith. This is done in order to avoid the tendency of the upper housing part 18*b* of the leading housing to become twisted out of alignment with the upper bonding tool 34 during the further pivotal movement of the upper part 18*b* of the leading housing. If the adjacent housing part 18*b* were not contacted by the plunger during the closing of the leading housing the adjacent upper part 18*b* would tend to spring back to its initial 90° position and cause the leading housing part 18*b*, due to the interconnecting hinge member 18*c*, to twist.

The bonding tool 36 is interconnected with an ultrasonic generator 58 which customarily operates in the range of 20,000 kilocycles. The generator will be caused to be operated only when the bonding tool 34 is in its lower position shown in FIGS. 6 and 7, and initiation of the operation of the ultrasonic generator will cause mating surfaces of the first and second housing parts 18*a* and 18*b* to become joined together. The plunger is customarily withdrawn at the initiation of the operating cycle of the ultrasonic generator 58. Immediately after the bonding operation by the tools 34, 36 commences and prior to retraction of the plunger 52, a shearing mechanism 60 (FIG. 3), which has a movable cutting blade 62, is activated to advance the cutting blade from its position in FIG. 5 towards the integral hinge members 18*c* to thereby sever the integral hinge members from the ends of the first and second housing parts 18a, 18b, thereby separating the leading clam-shell housing 18 from the adjacent clam-shell housing. The bonding and severing operations per se are substantially the same as that described in greater detail in co-pending U.S. application Ser. No. 427,746.

Figure 8:
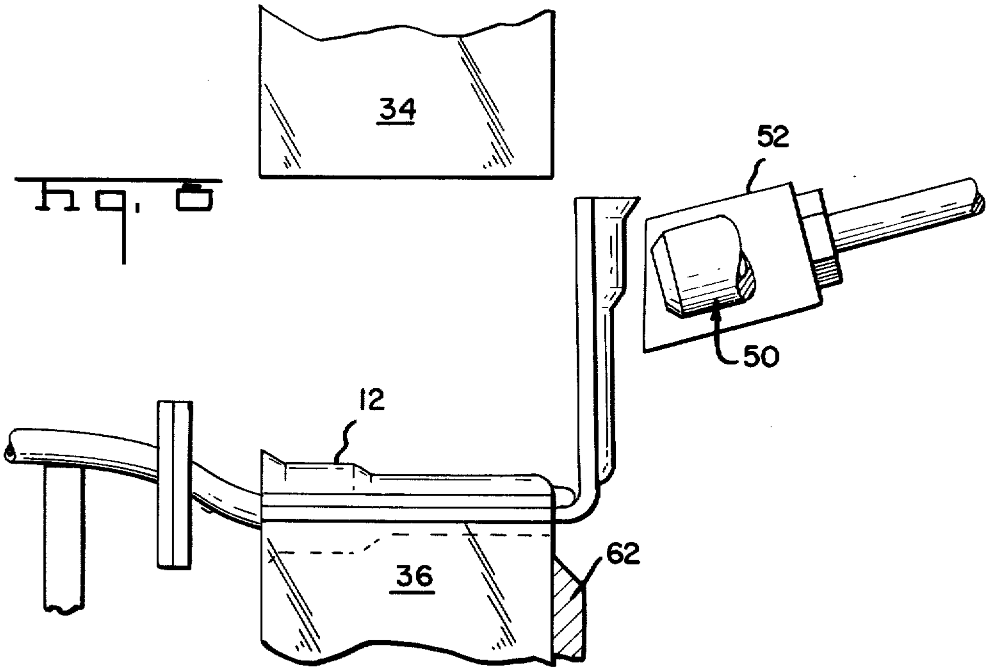
FIG. 8 is a view similar to FIG. 7 showing the bonding tools in a retracted position with the completed assembly resting on the seat of the lower bonding tool and now in final condition ready for removal from the assembly station.

After the bonding operation is completed, the upper bonding tool 34 is retracted to its initial position as shown in FIGS. 3 and 8. The insulated electrical connecting device 12 is now removed from between the tools 34, 36 in a suitable manner, preferably as desicrbed in detail in the aforementioned application Ser. No. 397,916.

DETAILED DESCRIPTION OF A SECOND EMBODIMENT

Figure 12:
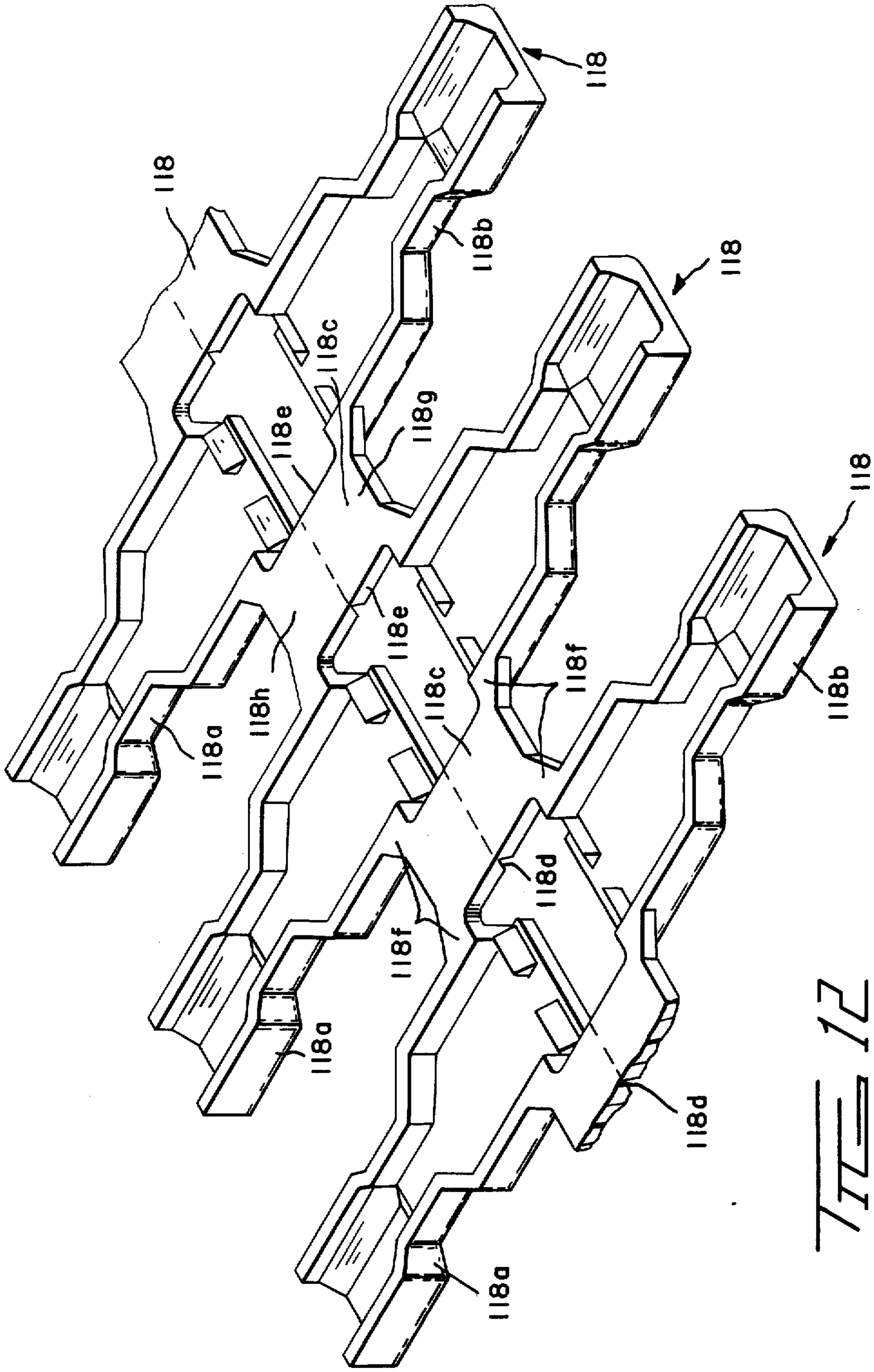
FIG. 12 is a perspective view of a second type of plurality of clam-shell housings, the individual housings of this type being joined together in strip form by integral hinge members which extend outwardly from the sides of the housing parts of the clam-shell housings.
Figure 13:
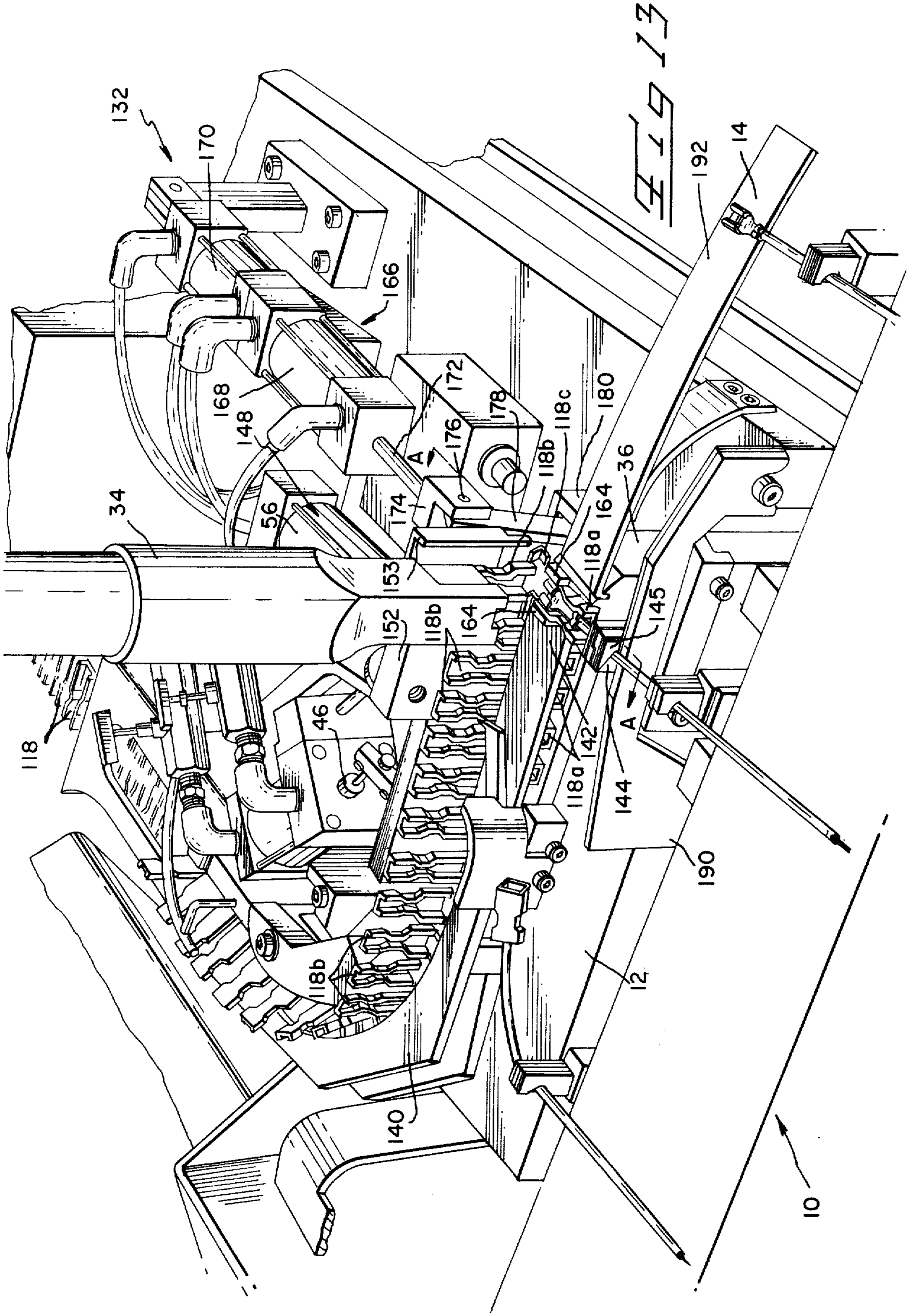
FIG. 13 is a view similar to FIG. 2 showing an apparatus in which a second embodiment of this invention is incorporated, the second type of clam-shell housing being shown associated with this embodiment.
Figure 14:
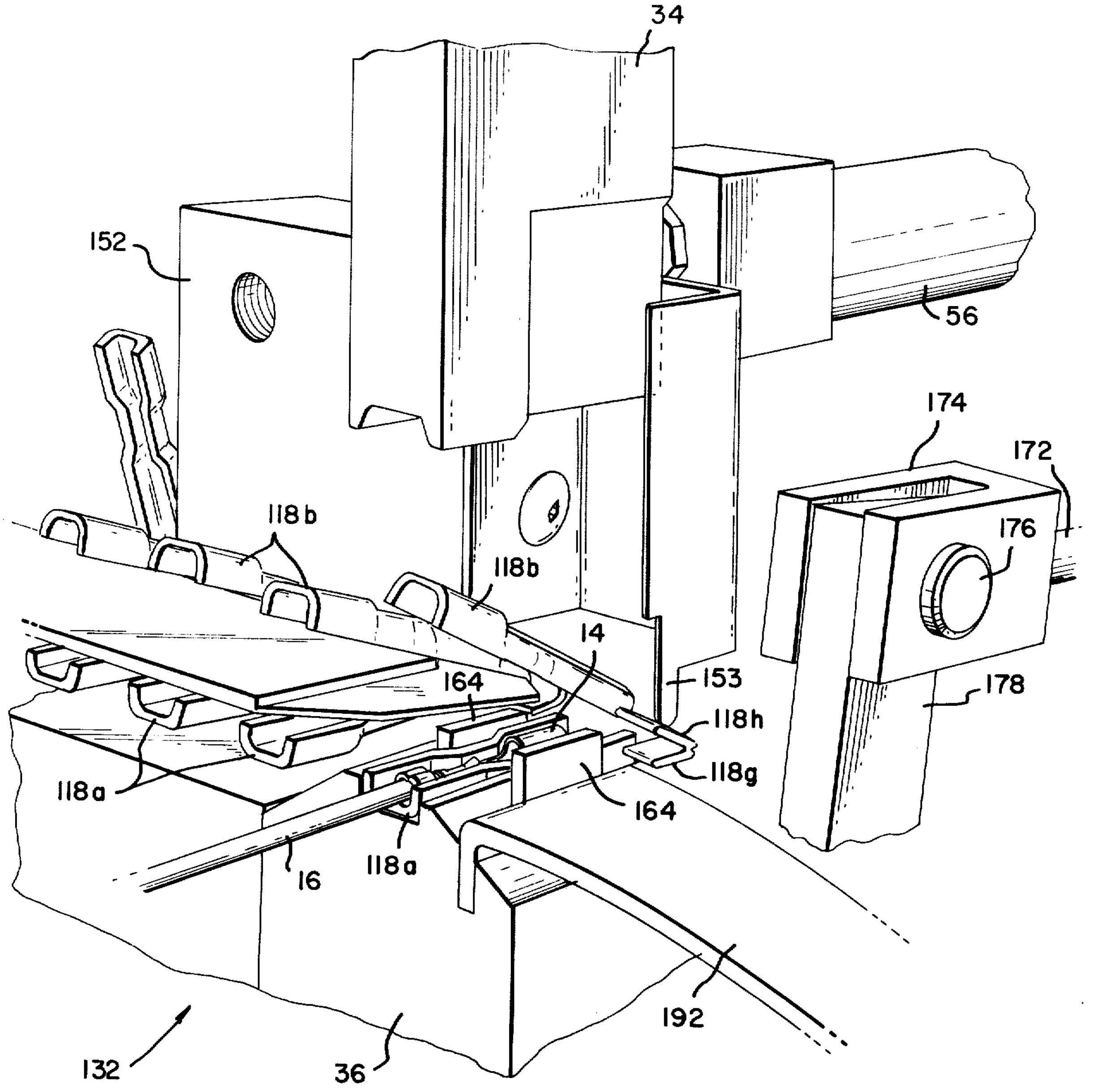
FIG. 14 is an enlarged perspective view of the apparatus shown in FIG. 13 showing the disposition of the parts after housing parts of clam-shell housing adjacent the leading clam-shell housing have been contacted by plunger means.
Figure 15:
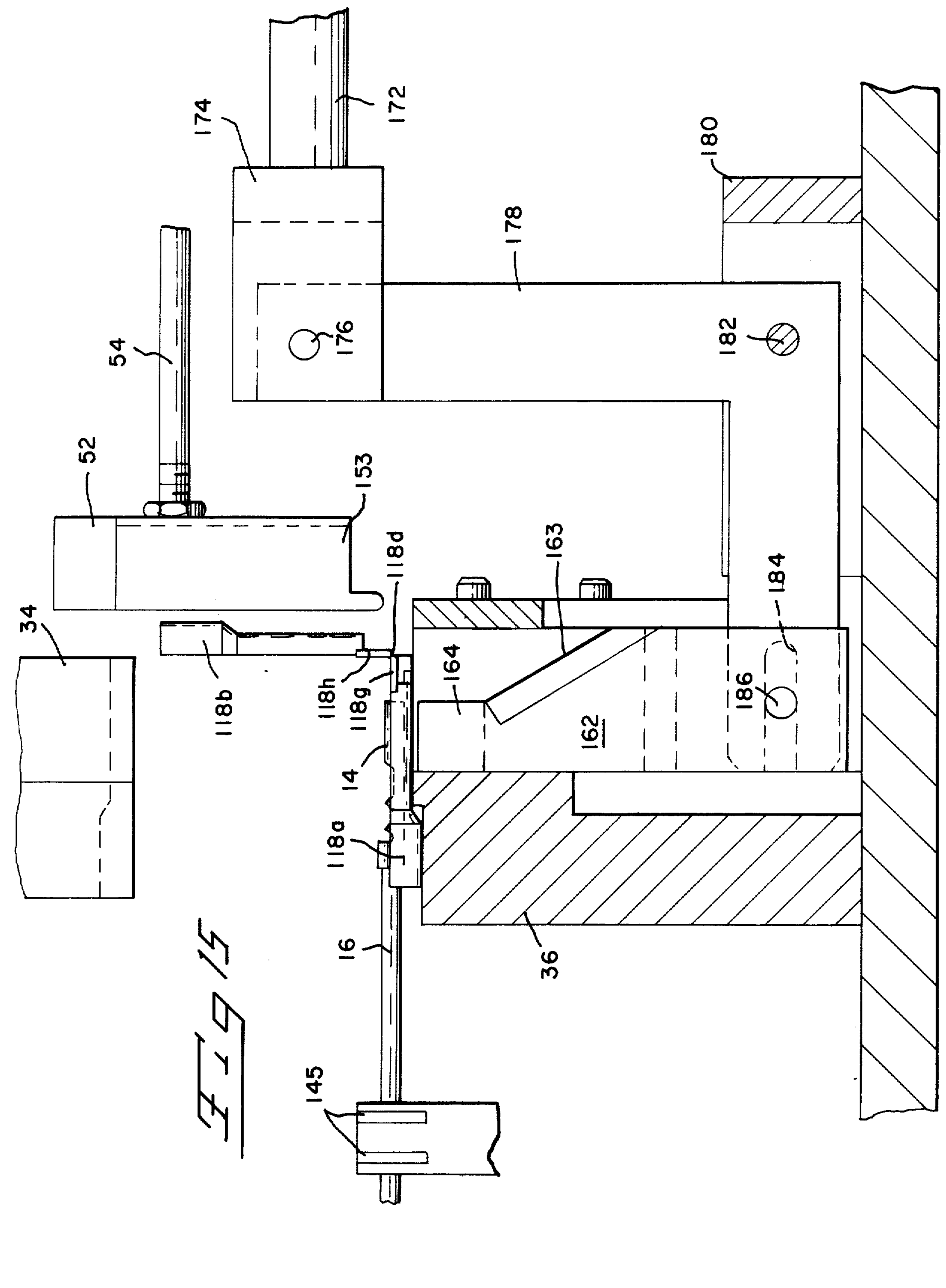
FIG. 15 is a side view of the apparatus shown in FIG. 13 taken generally along lines 15—15, an article being disposed between the housing parts of the leading open clam-shell housing.
Figure 16:
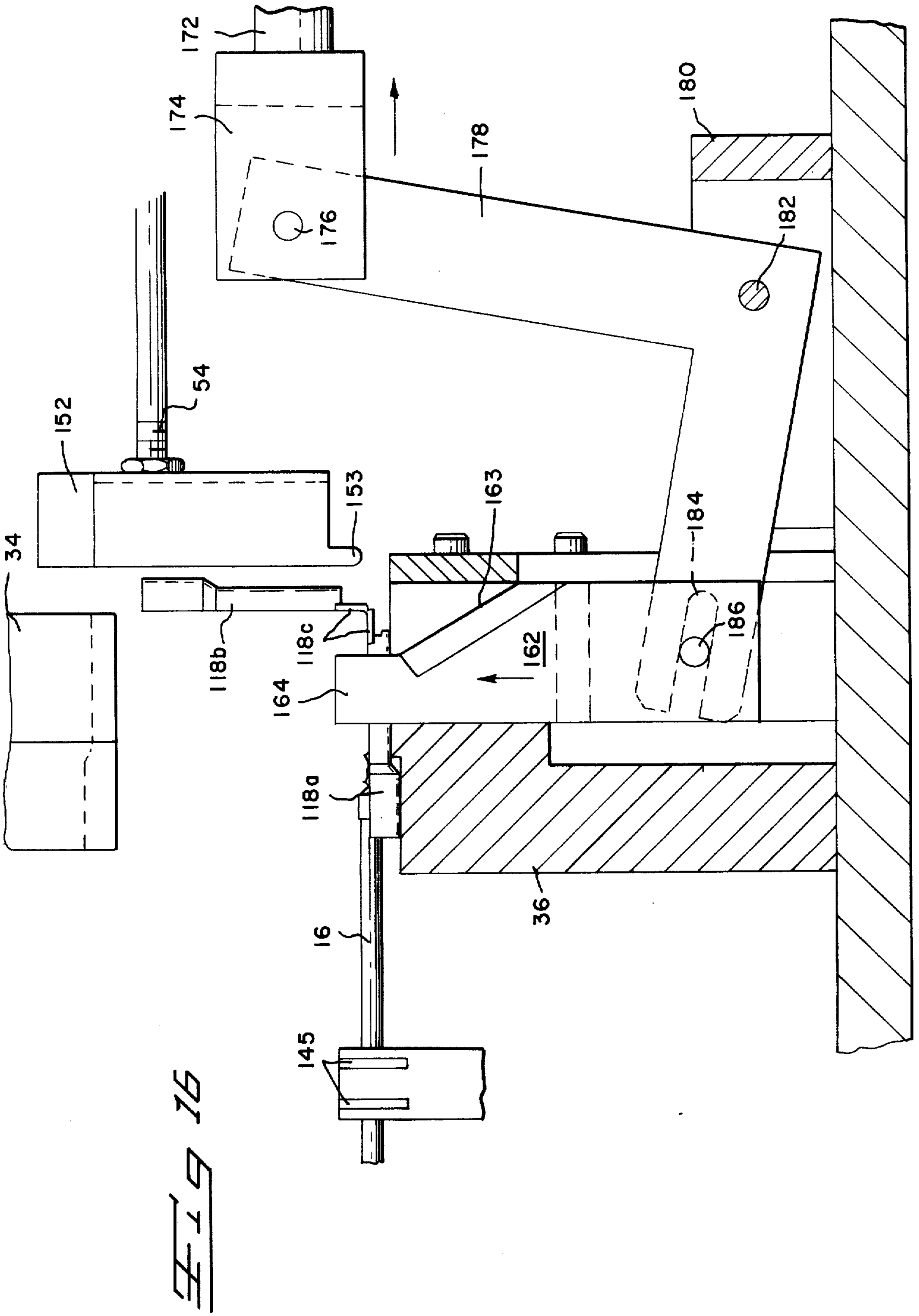
FIG. 16 is a view similar to FIG. 15 showing the manner in which an article is located within the leading housing.
Figure 17:
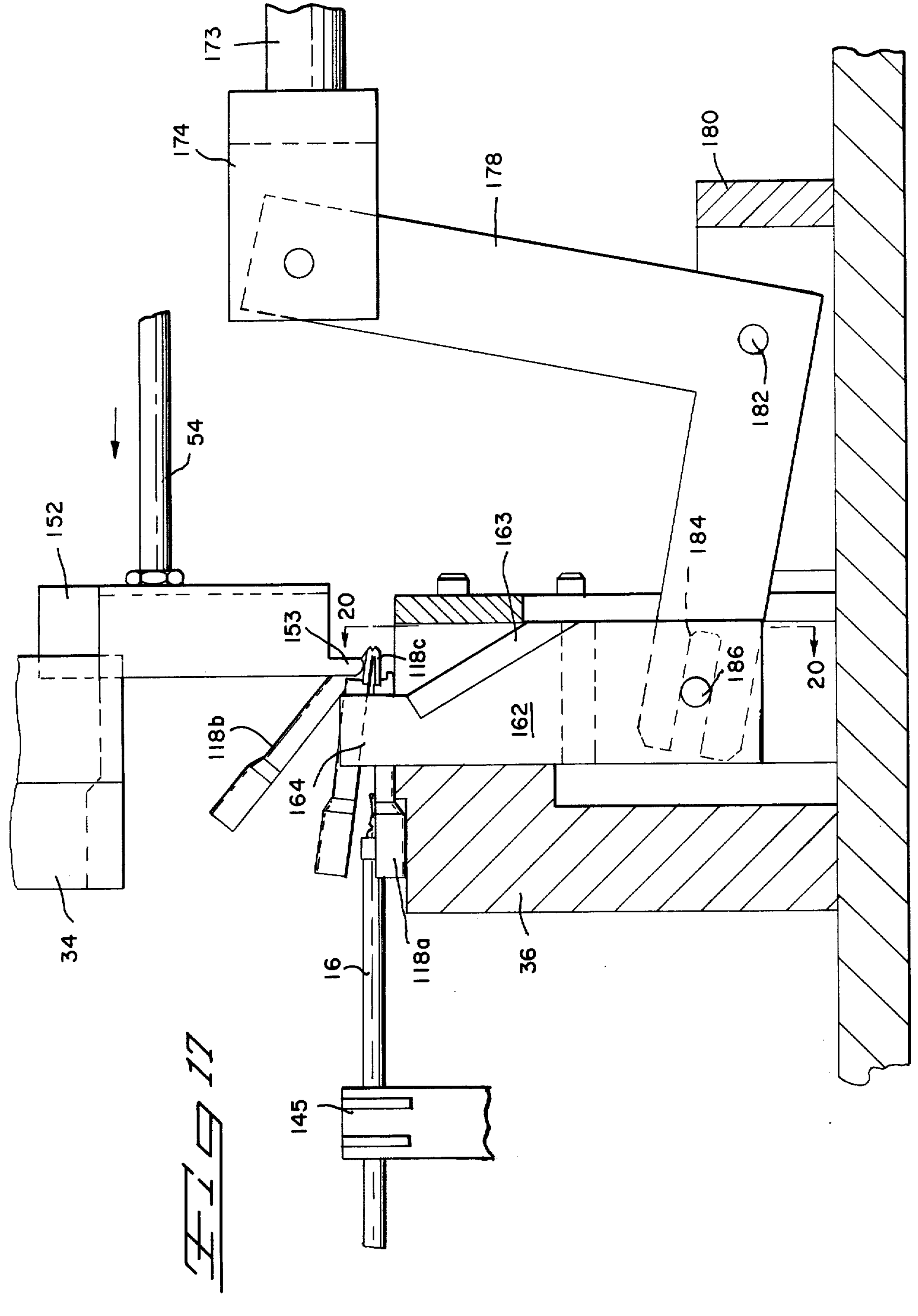
FIG. 17 is a view similar to FIG. 16 showing the disposition of the upper housing part of the leading housing after the plunger has been moved forwardly.
Figures 18, 19:
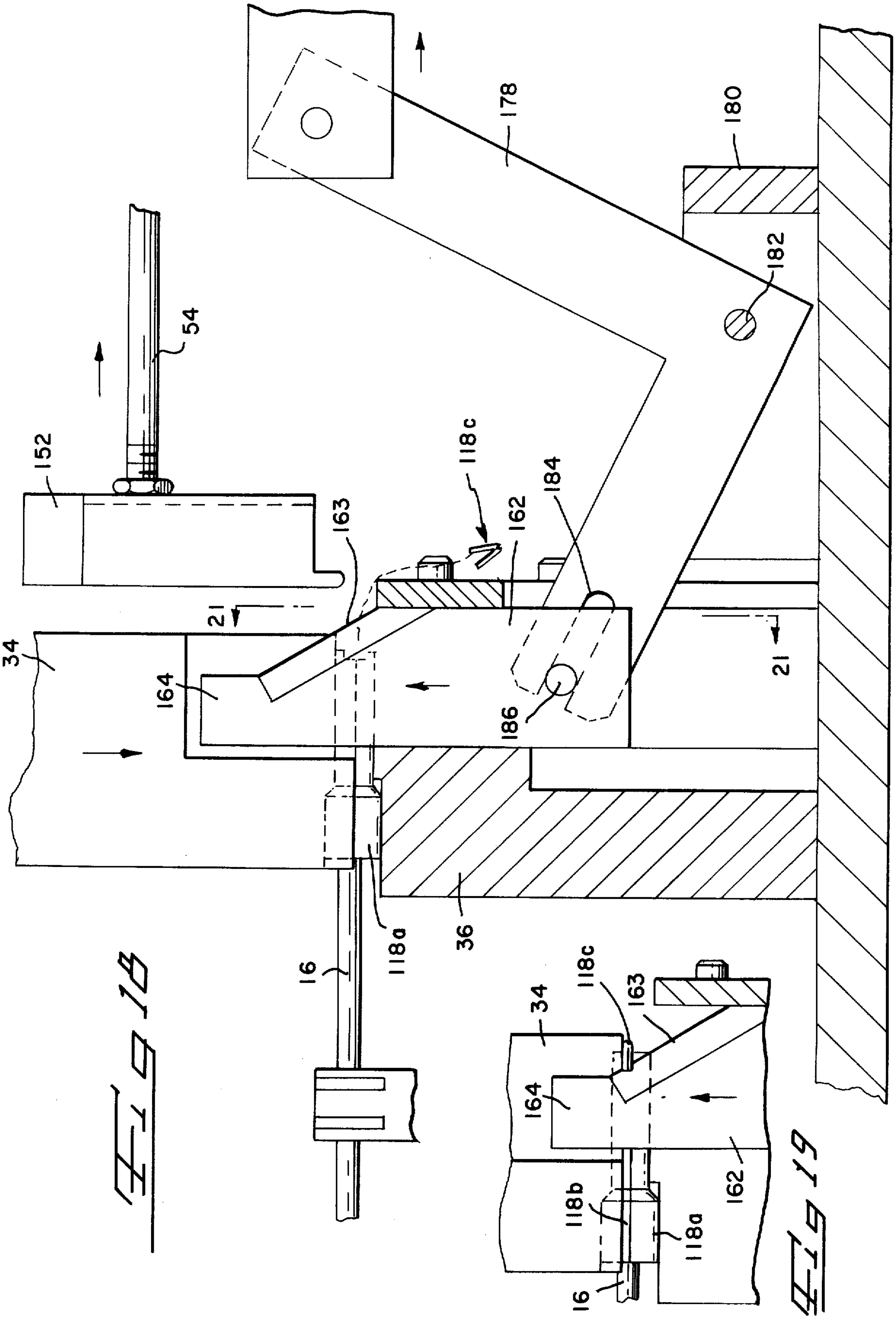
FIG. 18 is a view similar to FIG. 17 showing the disposition of the parts when the upper bonding tool is in its lowered position and also showing the manner in which the integral hinge members extend outwardly from the sides of the leading housing are sheared therefrom.
FIG. 19 is a fragmentary side view similar to FIG. 18 showing the initial shearing of the integral hinge members.

A second embodiment of the apparatus for assembling clam-shell housings about articles such as electrical terminals 14 is shown in FIGS. 13 through 21, this apparatus being adapted to secure housings 118 of a somewhat different form about terminals 14 which are supported by the bared end of lead wires 16. The housings which are adapted to be mounted about the terminals by this embodiment are best shown in FIG. 12, this Figure showing in perspective view a plurality of clam-shell housings which are initially in strip form, the clam-shell housings, indicated generally at 118, being interconnected to each other by integral hinge members 118c which extend outwardly from sides of the first and second housing parts 118a and 118b. Each of the integral hinge members is notched as at 118d to provide a bend line or hinge so that the housing parts 118a and 118b of each clam-shell housing may be pivotally moved towards and away from each other, the principle portion of each of the integral hinge members being divided by the bend line into a first or lower portion 118g and a second or upper portion 118h. The sides 118e of the principle portion of each of the integral hinge members 118c lie between the sides of the housing parts 118a and 118b, and triangular extensions 118f interconnect the principle portion of the hinge members with the sides of the various housing parts.

The apparatus shown in FIGS. 13 through 21 is adapted to be incorporated in the machine 10 shown in FIG. 1 and only the third station of this machine is shown in these Figures. The apparatus shown in these Figures, which is indicated generally at 132, includes an upper ultrasonic bonding tool 34 and a lower bonding tool 36 which are substantially the same as the bonding tools 34, 36 shown in FIGS. 1 through 8, with the exception of the seats which actually engage the housing parts, the seats in the tools having a slightly different configuration to more satisfactorily embrace the housing parts of the clam-shell housing and to transmit the ultrasonic bonding forces to their mating edges when they are in face to face engagement with each other.

The clam-shell housings 118 which are adapted to be successively closed about the terminals 14 are initially supplied to this apparatus in strip form, the strip being initially in a flat form such as that shown in FIG. 12. A guide track 140 initially bends the upper housing parts 118b to a position wherein they are disposed at a 90° orientation relative to the lower housing parts 118a, this construction being best shown in FIG. 13. In this regard it should be noted that the cam track 140 shown in this embodiment differs somewhat from the guide track shown in the embodiment of FIGS. 1 through 8. One end 142 of the guide track 140 is disposed adjacent the assembly station defined by the tools 34, 36. An article positioning mechanism, indicated generally at 144, is also disposed adjacent the assembly station, the article positioning mechanism 144 being generally similar to the article positioning mechanism 44 shown in the preceding Figures but differing in the provision of two pairs of spaced apart interlocking cam fingers 145, the two pairs of interlocking cam fingers 145 more positively insuring the positioning of the terminals 14 within the lower housing part 118a of the leading clam-shell housing. A feeding mechanism 46, which is substantially the same as in the preceding embodiment, advances one clam-shell housing to the assembly station during each cycle of the mechanism.

The operating principles of the second embodiment are generally the same in that the upper housing part 118b of the leading housing is caused to be disposed at an angle with respect to its lower housing part 118a by the operation of a reciprocal plunger mechanism 148 which contacts the upper housing part 118b of a plurality of clam-shell housings immediately adjacent the leading clam-shell housing disposed at the assembly station. This plunger mechanism differs in the respect that it contacts not only the upper housing part 118b of the clam-shell housing immediately adjacent the leading clam-shell housing, but also one or two additional adjacent upper housing parts 118b. Furthermore, the plunger 152 of the reciprocal plunger mechanism 148 is provided with an extension 153 which is adapted to contact the upper portion 118h of the integral hinge member 118c, the upper portion 118h contacted by the extension 153 being disposed on the side of the leading upper housing part which is opposite from the side of the leading upper housing part adjacent the housing part 118b contacted by the plunger 152. It has been found that when working with the clam-shell housings 118 of the type shown in FIG. 12 that by contacting the upper portion 118h of the hinge 118c with the extension 153 and also by contacting the housing parts 118b of a plurality of adjacent housings that it is not necessary to utilize an air blast to further close the upper housing part 118b of the leading housing prior to its being contacted by the tool 34. The plunger 152 is mounted on one end of a piston rod 54 which extends outwardly from a suitable cylinder 56.

A differing form of shearing mechanism is employed in this embodiment, the shearing mechanism being indicated generally at 160. The shearing mechanism includes a pair of spaced apart cutting blades 162, each of the cutting blades having an upwardly extending portion 164 which acts to center the terminals 14 within the lower housing part 118a of the leading clam-shell housing. The pair of blades are moved upwardly to initially position the centering portion 164 in the position shown in FIGS. 14, 16, and 20, and subsequently the pair of blades are moved upwardly to a fully raised position shown in FIGS. 18 and 21, this movement being accomplished by two stage linear actuator 166. The two stage linear actuator 166 includes two cylinders 168 and 170 (FIG. 13) which are operated in such a manner to advance the piston rod 172 in two stages of movement. The yoke 174 (FIG. 15) carried by an end of the piston rod 172 is pivotally interconnected by means of a pivot pin 176 with a bell crank 178, which is in turn pivotally secured to a support 180 by a pivot pin 182. The end of the bell crank remote from the yoke 74 is slotted as indicated in broken lines at 184, the slot receiving a pin 186, and the pin 186 being in turn secured to the pair of blades 162, the pair of blades also being interconnected with each other by a bridging portion 188 (FIGS. 20 and 21).

The operation of this embodiment, which is generally similar to the first embodiment, is as follows. A cycle of operation is initiated by causing the feeding mechanism 46 to be actuated and by also initiating movement of the conveyor 24. As the movement of the conveyor is initiated a completed connecting device 12 will be moved away from the assembly station defined by the tools 34, 36, and in this regard it should be noted that the support 190 (FIG. 13) will be moved upwardly to facilitate the removal of a completed connecting device from the seat within the lower tool 36, and will then be moved downwardly before the conveyor brings the next lead wire and terminal to the station 132. In the meantime the clam-shell housing which was disposed adjacent the assembly station will be fed into position at the assembly station by the feeding mechanism 46. After the new leading clam-shell housing has been positioned between the tools the conveyor will complete its movement by positioning an article which is to be assembled between the side walls of the upper and lower housing parts **118*b*, 118*a* of the new leading housing. The wire gatherer which carries the two pairs of cam fingers 145 will now be swung from their open position (not shown) to the closed position shown in FIG. 13. This movement will cause the terminal to be biased downwardly by the cam fingers 145 into the open cavity of the lower housing part 118*a* of the leading clam-shell housing. After the article 14 has been placed within the lower housing part 118*a* the two stage linear actuator 166 will be operated in a first stage to project the centering portions 164 upwardly to the position shown in FIGS. 14 and 16, this insuring that the article will be centered within the lower housing part 118*a*, even though it may have been initially cocked slightly to one side. Such initial cocking of the article is minimized however by the provision of a long ramp 192 which extends away from the assembly station and underlies an adjacent article when the conveyor 24 is at rest, as can be best seen in FIG. 13. At the same time the centering portions 164 are moved upwardly, the plunger is also moved in, the plunger contacting the upper housing parts 118*b* of those clam-shell housings immediately adjacent the leading clam-shell housing, the adjacent housings being to the left of the leading housing, and the plunger extension 153 also contacting the upper portion 118*h* of the integral hinge member 118*c* to the right of the leading housing to cause the upper housing part 118*b* of the leading housing to be disposed at an angle within the range of 30° to 45° relative to the lower housing part 118*a* of the leading housing. While the parts are in this position the upper ultrasonic bonding tool 34 will be moved downwardly to engage the upper surface of the upper housing part 118*b* of the leading clam-shell housing and to move it downwardly to the position shown in FIG. 18 wherein the mating surfaces of the first and second housing parts 118*a* and 118*b* are in engagement with each other. After the clam-shell housing has been closed about the article the ultrasonic generator 58 which is interconnected to the tool 34 will be operated to cause the mating surfaces to be bonded to each other. At the same time the ultrasonic generator commences operation the cylinder 56 will be actuated to retract the plunger 52, the two-stage linear actuator 166 will be actuated to move the pair of blades 162 upwardly to their second stage position to cause the shearing edges 163 of the blades 162 to sever the integral hinge members away from the sides of the closed clam-shell housing, this shearing operation being shown in sequence in FIGS. 17, 19, and 18, respectively, Also at this time the wire gatherers will open. After these operations have been completed the tool 34 will be moved upwardly to the position shown in FIG. 13 and the pair of blades will be moved fully down to the position shown in FIG. 15**. This will complete one cycle of operation.

Figure 20:
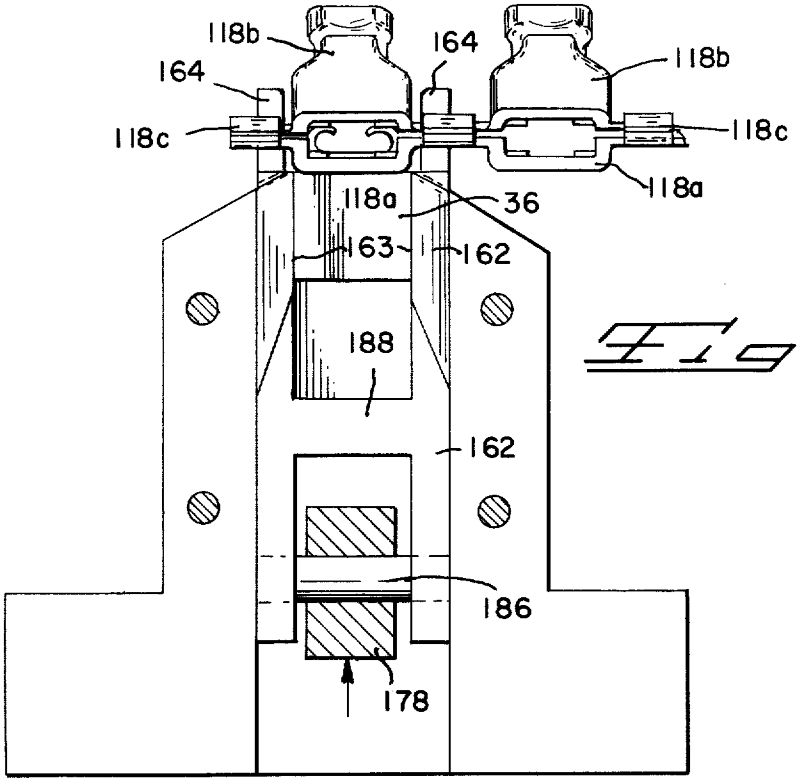
FIG. 20 is a rear sectional view taken along the line 20—20 in FIG. 17.
Figure 21:
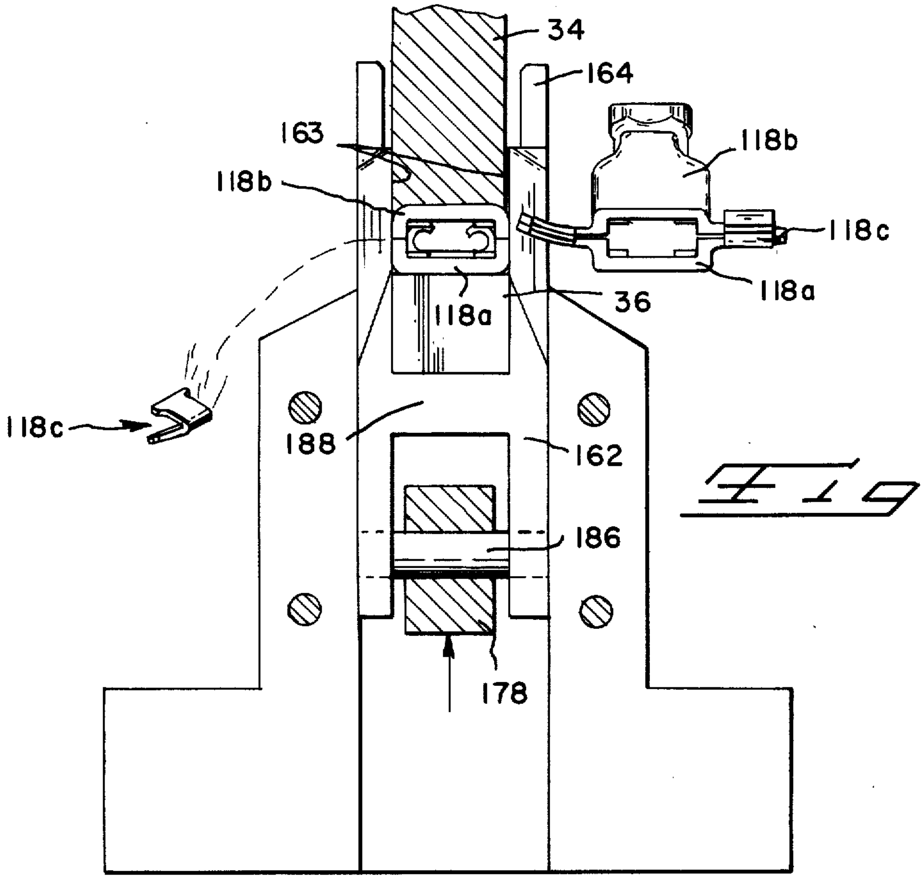
FIG. 21 is a rear sectional view taken along the lines 21—21 in FIG. 18.

As can be seen from FIGS. 21 and 20 the spacing between the facing surfaces of the centering portions 162 is greater than the spacing between the shearing edges 163. The spacing between the centering portions must be slightly greater than the width of the housing to prevent the inadvertent displacement of a housing from the seat in the lower tool 36 during the first stage of upward movement, such displacement could happen if the housing were oversized or disposed at a slight angle relative to the seat in the lower tool. However, in order to insure a satisfactory final product without undue burrs or the like, the shearing edges are more closely disposed to insure that the integral hinge members are sheared flush along the sides of the closed clam-shell housing. Displacement of the insulating housing from the seat in the lower tool is not possible during the second stage of upward movement of the blades 162 as the housing is held in position by the upper tool 34.

While two preferred embodiments in which the principles of the present invention have been incorporated are shown and described above, it is to be understood that the invention is not to be limited to the particular details, shown and described above, but that, in fact, widely differing means may be employed in the practice of the broader aspects of the invention.

What is claimed is:

1. An apparatus for closing clam-shell housings about articles such as electrical connectors, each of said clam-shell housings initially being interconnected to a plurality of other unassembled plastic clam-shell housings by integral hinge members, and each of said unassembled plastic clam-shell housings including first and second opposed housing sections, said plurality of clam-shell housings being joined together in such a manner that relative pivotal movement of the first and second housing parts of one of the unassembled housings towards and away from each other will cause corresponding relative pivotal movement of the integral hinge members which will in turn cause corresponding relative pivotal movement of the first and second housing parts of an adjacent housing; said apparatus including:

means to position a first open clam-shell housing of said plurality of interconnected housings at an assembly station;

means to place an electrical terminal within the first open clam-shell housing; and means operable to move the opposed housing parts of a second clam-shell housing of said plurality of interconnected housings towards each other to cause the first and second opposed housing parts of the first clam-shell housing to move towards each other over said terminal.

2. The apparatus set forth in claim 1 wherein the means to move the opposed housing parts include reciprocal plunger means located adjacent to said assembly station and movable towards and away from one of the opposed housing parts of said second clam-shell housing.

3. The apparatus set forth in claim 2 wherein said plunger is provided with extension means operable to contact a hinge member integral with said first housing and disposed adjacent one side of said first housing to that side opposite the second clam-shell housing.

4. The apparatus as defined in claim 1 further comprising:

means for impingeing a stream of air on one of the first and second housing parts of the first housing to facilitate the movement of the housing parts of the first housing towards each other.

5. The apparatus set forth in claim 1 in which the means for placing an electrical terminal within the first open clam-shell housing includes means operable to move said terminal laterally between opposed sides of the first and second housing parts of the first clam-shell housing.

6. An apparatus for successively positioning a leading unassembled open plastic clam-shell insulating housing of a plurality of interconnected clam-shell housings at an assembly station between assembly tools for subsequent closing of the open clam-shell housing about an electrical terminal, said assembly tools being movable relatively towards and away from each other along a predetermined path, each of the unassembled open clam-shell housings including a complementary pair of hinged first and second housing parts, said plurality of interconnected clam-shell housings being interconnected by integral plastic hinge members in such a manner that relative pivotal moving of said housing parts of one of said unassembled housings towards and away from each other will cause corresponding relative pivotal movement of the integral hinge members which will in turn cause corresponding relative pivotal movement of the housing of the adjacent housing said apparatus comprising:

means to position a leading unassembled housing of said plurality of interconnected clam-shell housings at said assembly station with its first housing part disposed between said tools in a generally transverse relationship to the path of said tools and with its second housing disposed in an open relationship to said first housing part in order to provide sufficient clearance between said housing parts in said leading housing for the placement of an electrical terminal in said leading housing, said positioning of said leading housing at said station causing the adjacent unassembled housing to be positioned adjacent said assembly station with it's corresponding housing parts being disposed in substantially the same relationship to each other as the housing parts of the leading housing are to each other;

means operable to place an electrical terminal in said leading housing; and means pivotally moving the second housing part of said adjacent housing towards its first housing part to a first predetermined angular displacement to thereby provide, via said interconnecting integral plastic hinge member, pivotal movement of said second housing part of said leading housing towards it's first housing part through a second predetermined angular displacement to a position where the second housing part of the leading housing is obliquely disposed across the predetermined path of the assembly tools between its first housing part and one of said assembly tools, whereby said second housing part of said leading housing is aligned for engagement by one of said tools without the aid of any physical means which would obstruct said relative movement of said tools towards each other during assembly of said housing parts of said leading housing to said article.

7. An apparatus for successively assembling the normally open clam-shell housings of a plurality of interconnected clam-shell housings about an electrical terminal, said normally open clam-shell housings initially being interconnected to a plurality of other clam shell housings by integral hinge members which interconnect the sides of adjacent clam-shell housings, and each of said clam-shell housings including first and second opposed housing parts; said apparatus comprising:

an assembly station having a seat adapted to receive a second housing part;

means operable to convey the leading normally open clam-shell housing of a plurality of interconnected housings to said assembly station;

means operable to position said article within said open clam-shell housing at said assembly station;

means operable to engage a first housing part of a normally open clam-shell housing adjacent said leading clam-shell housing and to move the first housing part towards the second housing part to cause corresponding movement of the first housing part at said assembly station;

tool means mounted at said assemble station and operable to close and bond the first housing part of the leading housing to the second housing part after the first housing part has been initially moved towards the second housing part; and shearing means operable to shear the integral hinge members from said leading housing.

8. The apparatus set forth in claim 7 further characterized by the provision of centering means operable to substantially center said electrical terminal relative to said seat.

9. The apparatus set forth in claim 8 wherein said centering means includes a pair of spaced apart engaging surfaces disposed to either side of said seat, and wherein said shearing means are a pair of spaced apart shears disposed to either side of said seat.

10. An apparatus for closing and bonding insulating housings about articles such as electrical terminals or the like, the insulating housing which is to be secured about an article being the leading housing of a plurality of clam-shell housings which are interconnected to each other in strip form by integral hinge members, each of said clam-shell housings including opposed first and second housing parts; said apparatus comprising:

an assembly station;

means operable to convey the leading clam-shell housing of said plurality of interconnected clam-shell housings to said assembly station along a generally linear path, said leading clam-shell housing being open when conveyed to said assembly station;

article conveying means operable to convey an article to said assembly station along a generally linear path in a direction opposite to the movement of the leading housing as it is conveyed to said assembly station;

means operable to engage one or more first housing parts of the open clam-shell housings immediately adjacent the leading clam-shell housing after it has been conveyed to the assembly station and to move said one or more first housing parts towards one or more corresponding opposed second housing parts to cause the first clam-shell housing part at said assembly station to have corresponding movement towards its opposed second housing part to partially close the leading clam-shell housing;

bonding tool means operable to engage the first housing part of the partially closed clam-shell housing at the assembly station and to move it into a closed position and to bond it to the second housing part in assembled relationship about said article; and means operable to shear said assembled clam-shell housing parts at said assembly station from interconnected hinge members.

11. The apparatus set forth in claim 10 wherein said article conveying means includes a plurality of spaced apart conveying members, and said apparatus further being characterized by the provision of ramp means extending away from said assembly station and underlying an article which is to be assembled at said assembly station when said article is supported by a spaced apart conveying member as another article is being assembled within the leading clam-shell housing at said assembly station.

12. In an apparatus adapted to place articles, such as electrical connectors or the like, within an open leading clam-shell housing having opposed housing parts, and to subsequently close the opposed housing parts of the leading clam-shell housing and to bond the opposed housing parts of the clam-shell housing to each other to assemble said article within said housing at an assembly station which has a seat that receives one of the housing parts of the leading clam-shell housing, said leading clam-shell housing initially being interconnected to a plurality of other open clam-shell housings by integral hinge members which extend outwardly from the sides of said opposed housing parts, the combination therewith of centering means operable to center said one housing part of the leading clam-shell housing relative to said seat at said assembly station prior to the closing and bonding of the other housing part to said one housing part about said article; and shearing means operable to shear the integral hinge members from said leading housing after said leading clam-shell housing has been closed about said article.

13. The combination set forth in claim 12 wherein said centering and shearing means are a pair of spaced apart structures disposed to either side of said seat, each of said structures including an upper centering portion and a lower shearing portion.

14. The apparatus set forth in claim 13 wherein the opposed facing surfaces of the upper centering portions are more widely spaced apart than the opposed lower shearing surfaces whereby the article will not be moved out of said seat as it is being centered and also to provide for shearing of the hinge members immediately adjacent the sides of said leading clam-shell housing.

15. The apparatus set forth in claim 13 wherein said pair of centering and shearing structures are interconnected to a common actuating mechanism, said actuating mechanism initially moving said pair of structures upwardly a first amount to center the clam-shell housing relative to said seat, and then upwardly a second amount to shear the integral hinge members from said leading clam-shell housing.

16. In an apparatus for assembling insulation housings over electrical terminals by conveying a strip of interconnected insulation housings in turn to a work station, and at the work station supporting each housing and closing together opposed portions of each housing over a corresponding electrical terminal, the improvement comprising:

positioning means at said work station for inserting an electrical terminal and positioning the same on a first housing of said strip, deflecting means engageable on said strip at a location separated from said first housing for deflecting said strip and thereby closing together at least partially the opposed portions of said first housing, and securing means reciprocable toward and away from the at least partially closed opposed portions of said first housing and retaining said opposed portions of said first housing in fully closed relationship while said deflecting means remains separated from said first housing for securing together the opposed portions of said first housing over said terminal.

17. The structure as recited in claim 16 and further including:

separating means for separating said first housing from the remainder of said strip subsequent to securing together the opposed portions of said first housing over said terminal.

18. The structure as recited in claim 16 wherein said housings are separably interconnected by integral hinge portions projecting outwardly of corresponding housings, and said deflecting means engages and deflects an integral hinge portion adjacent said first housing for closing together at least partially the opposed portions of said first housing prior to reciprocation of said securing means.

19. The structure as recited in claim 18, and further including:

severing means for severing said first housing from said adjacent integral hinge portion subsequent to securing together the opposed portions of said first housing over said terminal.

20. The structure as recited in claim 16, wherein, said deflecting means is engageable on another housing adjacent said first housing to deflect said strip and thereby close together at least partially the opposed portions of said first housing.

21. The structure as recited in claim 16, and further including:

air impinging means for impinging a stream of air on said first housing at said work station, said air impinging means acting simultaneously with said deflecting means to close together at least partially said opposed portions of said first housing prior to reciprocation of said securing means.

* * * * *

UNITED STATES PATENT OFFICE

CERTIFICATE OF CORRECTION

PATENT NO. : 3,955,275

DATED : May 11, 1976

INVENTOR(S) : PHILLIP EUGENE LOOMIS & JOE PIERCE MORGAN

It is certified that error appears in the above-identified patent and that said Letters Patent are hereby corrected as shown below:

Column 7, line 9, "397,908" should be ---367,908---.

Column 7, line 33, "397,916" should be ---367,916---.

Signed and Sealed this

Sixteenth Day of November 1976

[SEAL]

*Attest:*

RUTH C. MASON
*Attesting Officer*

C. MARSHALL DANN
*Commissioner of Patents and Trademarks*